US010714709B2

(12) United States Patent
Jang et al.

(10) Patent No.: US 10,714,709 B2
(45) Date of Patent: *Jul. 14, 2020

(54) ORGANIC ELECTROLUMINESCENCE DISPLAY DEVICE INCLUDING CONVEX CURVE OR CONCAVE CURVE AND METHOD OF FABRICATING THE SAME

(71) Applicant: LG Display Co., Ltd., Seoul (KR)

(72) Inventors: Ji-Hyang Jang, Goyang-si (KR); So-Young Jo, Seoul (KR); Won-Hoe Koo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/505,489

(22) Filed: Jul. 8, 2019

(65) Prior Publication Data

US 2019/0334126 A1 Oct. 31, 2019

Related U.S. Application Data

(63) Continuation of application No. 15/846,812, filed on Dec. 19, 2017, now Pat. No. 10,381,601.

(30) Foreign Application Priority Data

Dec. 20, 2016 (KR) .................. 10-2016-0174658

(51) Int. Cl.
*H01L 51/52* (2006.01)
*H01L 27/32* (2006.01)
*H01L 51/50* (2006.01)

(52) U.S. Cl.
CPC ...... *H01L 51/5275* (2013.01); *H01L 27/3258* (2013.01); *H01L 51/5012* (2013.01); *H01L 51/5209* (2013.01); *H01L 51/5225* (2013.01)

(58) Field of Classification Search
CPC ............. H01L 51/5275; H01L 51/5012; H01L 51/5209
See application file for complete search history.

(56) References Cited

U.S. PATENT DOCUMENTS 7,906,898 B2 3/2011 Lee
9,024,305 B2 5/2015 Choi et al.
(Continued)

FOREIGN PATENT DOCUMENTS

CN 104022144 A1 9/2014
CN 104466006 A1 3/2015

OTHER PUBLICATIONS

First Notification of Office Action dated May 5, 2019, from the China National Intellectual Property Administration in counterpart Chinese application No. 201711382965.1.

*Primary Examiner* — Quoc D Hoang
(74) *Attorney, Agent, or Firm* — Morgan, Lewis & Bockius LLP

(57) ABSTRACT

Provided are an organic light-emitting diode (OLED) and an organic light-emitting device including the same. The OLED includes a first electrode, an organic emissive layer which includes a plurality of convex curves or a plurality of concave curves in a light-emitting region and of which a slope of an inclined plane of an upper region with respect to a horizontal line dividing a height of the plurality of convex curves into halves is greater than a slope of an inclined plane of a lower region thereof, and a second electrode provided on the organic emissive layer. Accordingly, the OLED and the organic light-emitting device including the same are capable of improving current efficiency.

15 Claims, 8 Drawing Sheets

(56) References Cited

U.S. PATENT DOCUMENTS

| | | |
|---|---|---|
| 10,381,601 B2 * | 8/2019 | Jang .................... H01L 51/5275 |
| 2008/0122347 A1 | 5/2008 | Lee |
| 2016/0240588 A1 | 8/2016 | Yi |
| 2018/0090717 A1 | 3/2018 | Lim et al. |

* cited by examiner

ORGANIC ELECTROLUMINESCENCE DISPLAY DEVICE INCLUDING CONVEX CURVE OR CONCAVE CURVE AND METHOD OF FABRICATING THE SAME

CROSS-REFERENCE TO RELATED APPLICATIONS

This is a continuation application of U.S. patent application Ser. No. 15/846,812 filed on Dec. 19, 2017, which claims the priority benefit of Korean Patent Application No. 10-2016-0174658 filed in Republic of Korea on Dec. 20, 2016, both of which is hereby incorporated herein by reference in its entirety for all purposes as if fully set forth herein.

BACKGROUND

Technical Field

The present disclosure relates to an organic light-emitting diode (OLED) and an organic light-emitting device including the same.

Discussion of the Related Art

Light emitted from an organic emissive layer of an organic light-emitting device passes through various components of the organic light-emitting device and is then discharged to the outside of the organic light-emitting device. However, a part of the light emitted from the organic emissive layer may not be discharged to the outside of the organic light-emitting device and becomes trapped inside the organic light-emitting device, thereby decreasing light extraction efficiency of the organic light-emitting device.

In particular, in a bottom-emission type organic light-emitting device among organic light-emitting devices, about 50% of light emitted from an organic emissive layer is totally reflected from or absorbed by an anode electrode and is thus trapped inside the organic light-emitting device, and about 30% of the light emitted from the organic emissive layer is totally reflected from or absorbed by a substrate and is thus trapped inside the organic light-emitting device. As described above, about 80% of the light emitted from the organic emissive layer is trapped inside the organic light-emitting device and only about 20% of the emitted light is extracted to the outside. Therefore, luminous efficiency is very low.

To improve the light extraction efficiency of the organic light-emitting device, a method of attaching a micro-lens array (MLA) to an outer side of the substrate of the organic light-emitting device or a method of forming a micro-lens inside the organic light-emitting device has been suggested.

However, even if the MLA is attached to the outer side of the substrate of the organic light-emitting device or the micro-lens is formed inside the organic light-emitting device, a large amount of light is trapped inside the organic light-emitting device and thus the amount of the light extracted to the outside is small. Furthermore, a part of light incident from the substrate is reflected according to a state of a polarization axis of a polarizing plate due to the use of the MLA or the micro-lens. Accordingly, the reflectance (or diffuse reflectance) of the organic light-emitting device may increase.

SUMMARY

Accordingly, embodiments of the present disclosure are directed to an organic light emitting diode and an organic light emitting device including the same that substantially obviates one or more of the problems due to limitations and disadvantages of the related art An aspect of the present disclosure is to provide an organic light-emitting diode (OLED) capable of decreasing reflectance and an organic light-emitting device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an OLED and an organic light-emitting device having the same comprise a substrate divided into a light-emitting region and a non-light-emitting region. In one embodiment, the OLED and the organic light-emitting device having the same include an overcoat layer which is provided on the substrate and includes a plurality of peak portions or a plurality of concave portions in the light-emitting region and of which a slope of an inclined plane of the plurality of peak portions is greater than that of an inclined plane of the plurality of concave portions. In one embodiment, the OLED and the organic light-emitting device having the same include a first electrode provided on the overcoat layer. In one embodiment, the OLED and the organic light-emitting device having the same include an organic emissive layer provided on the first electrode. In one embodiment, the OLED and the organic light-emitting device having the same include a second electrode provided on the organic emissive layer.

According to one or more embodiments, an OLED and an organic light-emitting device having the same include a substrate divided into a light-emitting region and a non-light-emitting region. In another embodiment, the OLED and the organic light-emitting device having the same include an overcoat layer provided on the substrate. In another embodiment, the OLED and the organic light-emitting device having the same include a first electrode provided on the overcoat layer. In another embodiment, the OLED and the organic light-emitting device having the same include an organic emissive layer which is provided on the first electrode and includes a plurality of convex curves or a plurality of concave curves in the light-emitting region and of which a slope of an inclined plane of the plurality of convex curves is greater than that of an inclined plane of the plurality of concave curves. In another embodiment, the OLED and the organic light-emitting device having the same include a second electrode provided on the organic emissive layer and having a shape according to a shape of a top surface of the organic emissive layer.

According to one or more embodiments, an OLED and an organic light-emitting device having the same include an organic emissive layer which is provided on a first electrode and includes a plurality of convex curves or a plurality of concave curves and of which a slope of an inclined plane of an upper region with respect to a horizontal line dividing a height of the plurality of convex curves into halves is greater than that of an inclined plane of a lower region thereof. In another embodiment, the OLED and the organic light-emitting device having the same include a second electrode provided on the organic emissive layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

DETAILED DESCRIPTION

Figure 1:
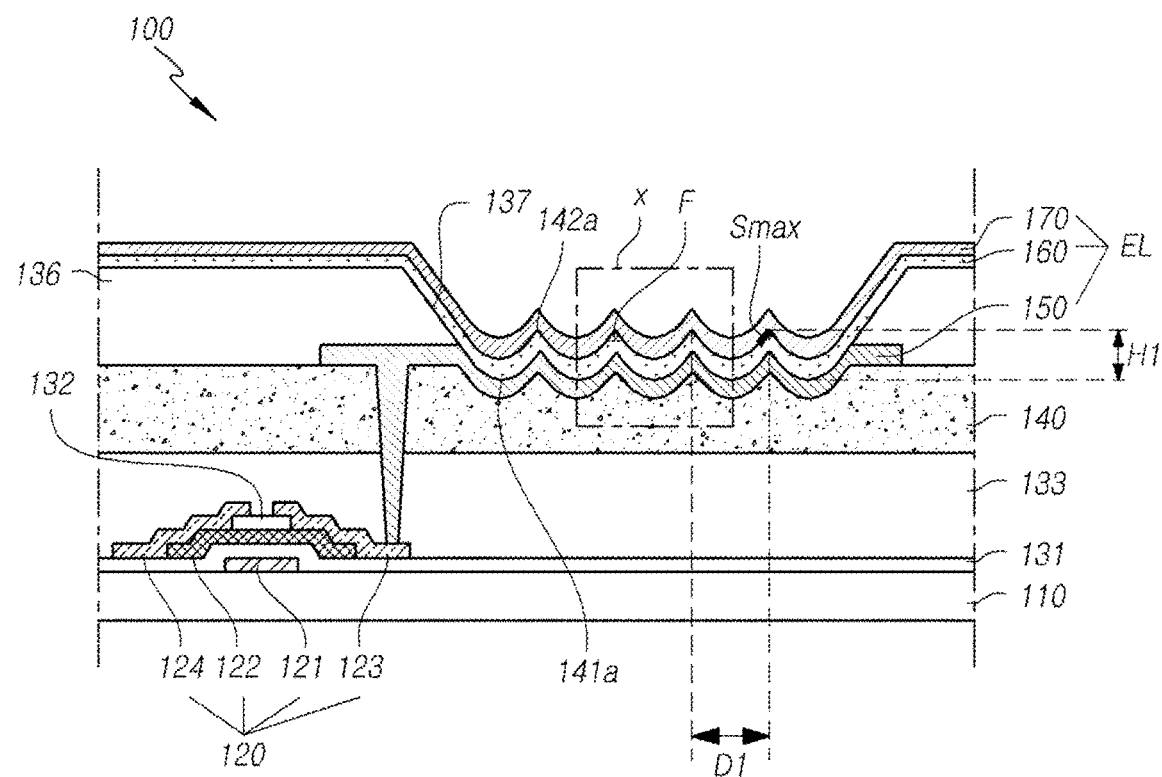
FIG. 1 is a cross-sectional view of an organic light-emitting display device to which an embodiment is applied.

Hereinafter, embodiments of the present disclosure will be described with reference to the accompanying drawings. Embodiments set forth herein are provided as examples to sufficiently deliver the idea of the present disclosure to those of ordinary skill in the art. Thus, the present disclosure should not be construed as being limited to these embodiments and may be embodied in many different forms. In the drawings, the sizes, thicknesses, etc. of devices may be exaggerated for convenience of explanation. Like reference numerals designate like elements throughout.

Advantages and features of the present disclosure and methods of achieving them will be apparent by referring to embodiments set forth herein in conjunction with the appended drawings. However, the present disclosure should not be construed as being limited to embodiments and may be embodied in many different forms. Rather, these embodiments are provided so that the present disclosure will be thorough and complete and will fully convey the concept of the present disclosure to those of ordinary skill in the art. The present disclosure should be defined by only the scope of the claims. Like reference numerals designate like elements throughout. In the drawings, the sizes of layers and regions and the relative sizes thereof may be exaggerated for clarity.

It will be understood that when an element or layer is referred to as being "above" or "on" another element or layer, the element or layer can be directly on another element or layer or intervening elements or layers. In contrast, when an element or layer is referred to as being "directly above" or "directly on" another element or layer, there are no intervening elements or layers present.

Spatially relative terms, such as "below", "beneath", "lower", "above", "upper" and the like, may be used herein for ease of description to describe the relationship of one element or feature to another element(s) or feature(s) as illustrated in the drawings. It will be understood that the spatially relative terms are intended to encompass different orientations of each element in use or operation, in addition to the orientation depicted in the drawings. For example, if each element illustrated in the drawings is inverted, the element described as "below" or "beneath" other elements would then be oriented "above" the other elements. Thus, the exemplary term "below" can encompass both orientations of above and below.

When components of the present disclosure are described below, the terms "first," "second," "A," "B," "(a)," "(b)," and the like may be used. These terms are only used to distinguish one component from other components. Thus, the essential features, order, sequence, or number of the components is not limited by these terms.

FIG. 1 is a cross-sectional view of an organic light-emitting display device to which an embodiment is applied. Referring to FIG. 1, an organic light-emitting display device 100 to which an embodiment is applied includes a thin-film transistor (TFT) 120 including a gate electrode 121, an active layer 122, a source electrode 123 and a drain electrode 124; and an organic light-emitting diode (OLED) EL electrically connected to the TFT 120, and including a first electrode 150, an organic emissive layer 160 and a second electrode 170.

In detail, the gate electrode 121 is provided on a substrate 110. A gate insulating layer 131 is provided on the gate electrode 121 and the substrate 110 to insulate the gate electrode 121 and the active layer 122. The active layer 122 is provided on the gate insulating layer 131. An etch stopper 132 is provided on the active layer 122. The source electrode 123 and the drain electrode 124 are provided on the active layer 122 and the etch stopper 132. The source electrode 123 and the drain electrode 124 are electrically connected to the active layer 122 in such a manner so as to be in contact with the active layer 122, and are provided in a region of the etch stopper 132. Alternatively, the etch stopper 132 may not be provided.

For convenience of explanation, FIG. 1 illustrates only a driving TFT among various TFTs applicable to the organic light-emitting display device 100. Furthermore, although FIG. 1 illustrates that the TFT 120 has an inverted staggered structure or a bottom gate structure, in which the gate electrode 121 is disposed opposite the source electrode 123 and the drain electrode 124 with respect to the active layer 122, a TFT having a coplanar structure or a top gate structure in which the gate electrode 121 is located on the same side as the source electrode 123 and the drain electrode 124 with respect to the active layer 122 is also available.

A passivation layer 133 is provided on the TFT 120. An overcoat layer 140 is provided on the passivation layer 133.

Although not shown in FIG. 1, a color filter layer may be provided between the passivation layer 133 and the overcoat layer 140. The color filter layer may be provided at a location corresponding to a light-emitting region of the organic light-emitting display device 100.

The first electrode 150 of the OLED EL is provided on the overcoat layer 140. A bank pattern 136 defining a light-emitting region and a non-light-emitting region is provided on portions of top surfaces of the overcoat layer 140 and the first electrode 150. The organic emissive layer 160 and the second electrode 170 of the OLED EL are provided on the first electrode 150 and the bank pattern 136.

The organic emissive layer 160 has a stacked structure (tandem white) of a plurality of emissive layers to emit white light. The organic emissive layer 160 may include a first organic emissive layer emitting blue light, and a second organic emissive layer provided on the first organic emissive layer and emitting light having a color making white when mixed with blue. The second organic emissive layer may be, for example, an organic emissive layer emitting yellowish green light. Alternatively, the organic emissive layer 160 may include only an organic emissive layer emitting blue, red, or green light.

Regions of the organic emissive layer 160 and the second electrode 170 corresponding to the light-emitting region may have a plurality of curves including a plurality of convex curves 142a or a plurality of concave curves 141a. Alternatively, the region of each of the organic emissive layer 160 and the second electrode 170 corresponding to the light-emitting region according to an embodiment may have at least one curve among a plurality of convex curves and a plurality of concave curves.

In this case, a slope of an inclined plane of the plurality of convex curves 142a of the organic emissive layer 160 may be greater than that of an inclined plane of the plurality of concave curves 141a thereof. Accordingly, each of regions of the organic emissive layer 160 may have an appropriate thickness and thus the current efficiency and light extraction efficiency of the organic light-emitting display device 100 may be improved. In detail, the plurality of convex curves 142a of the organic emissive layer 160 may be thinner than the plurality of concave curves 141a thereof.

In the OLED EL, the highest electric field is applied to a thinnest region (a region corresponding to the plurality of convex curves 142a) of the organic emissive layer 160 and thus major emission occurs in this region. That is, major emission may occur at the plurality of convex curves 142a of the organic emissive layer 160 of the OLED EL.

The thickness of each of the regions of the organic emissive layer 160 may vary according to a shape of the organic emissive layer 160, in other words, a shape of the plurality of convex curves 142a or the plurality of concave curves 141a of the organic emissive layer 160. For convenience of explanation, embodiments will be described with respect to the shape of the plurality of convex curves 142a of the organic emissive layer 160 below.

Variables which determine the shape of the plurality of convex curves 142a of the organic emissive layer 160 may include a diameter D1, a height H1, an aspect ratio A/R1, a full width at half maximum F1, a full width at half maximum aspect ratio F1_A/R1(=H/F), a slope S1, a half height aspect ratio-versus-aspect ratio Rm1 (ratio of MLA=(F_A/R)/(A/R)), etc. of the plurality of convex curves 142a of the organic emissive layer 160.

The diameter D1 of the convex curves 142a of the organic emissive layer 160 refers to the distance between centers of two adjacent convex curves 142a. The height H1 of the convex curves 142a of the organic emissive layer 160 refers to a vertical length of the convex curves 142a from bottom to top. The full width at half maximum F1 refers to a width of the convex curves 142a at a half the height thereof as illustrated in FIG. 1. The aspect ratio A/R1 of the convex curves 142a refers to a value obtained by dividing the height H1 of the convex curves 142a by a radius D1/2 of the convex curves 142a.

In one embodiment, the diameter D1 of the convex curves 142a of the organic emissive layer 160 may be 1 μm to 5 μm, and the aspect ratio A/R1 of the convex curves 142a may be 0.3 to 0.5. The full width at half maximum F1 of the convex curves 142a may be 0.975 μm to 1.5 μm. Thus, the full width at half maximum aspect ratio F1_A/R1(=H/F) of the convex curve 142a may be 0.4 to 0.75.

As described above, when the aspect ratio A/R1 of the convex curves 142a of the organic emissive layer 160 is 0.3 to 0.5, the full width at half maximum aspect ratio F1_A/R1(=H/F) increases and thus a condition that the half height aspect ratio-versus-aspect ratio Rm1 should be 1.2 or more is satisfied. The half height aspect ratio-versus-aspect ratio Rm1 of the convex curves 142a is a ratio between the full width at half maximum aspect ratio F1_A/R1 and the aspect ratio A/R1, and may be a variable which determines a region with the steepest maximum slope Smax.

Thus, in the organic light-emitting display device 100 according to an embodiment, the aspect ratio A/R1 of the convex curves 142a of the organic emissive layer 160 may be a small value of 0.3 to 0.5. Due to the range of the aspect ratio A/R1 of the convex curves 142a, the full width at half maximum aspect ratio F1_AR1 may be 0.4 to 0.75.

Since the half height aspect ratio-versus-aspect ratio Rm1 is 1.2 or more, a region with the maximum slope Smax of the organic emissive layer 160 may correspond to the plurality of convex curves 142a. The thinnest region of the organic emissive layer 160 may be the region with the maximum slope Smax of the organic emissive layer 160. In other words, a region of the organic emissive layer 160 including the plurality of convex curves 142a may have the maximum slope Smax.

In another aspect, an upper region of the organic emissive layer 160 with respect to a horizontal line dividing the height H1 of the convex curves 142a of the organic emissive layer 160 into halves may have the maximum slope Smax. A slope of an inclined plane of a lower region of the organic emissive layer 160 with respect to the horizontal line dividing the height H1 of the convex curves 142a of the organic emissive layer 160 into halves may be less than that of an inclined plane of the upper region.

An effective light-emitting region in which an electric field is locally concentrated may occur in a region of the organic emissive layer 160 of which a slope of an inclined plane is great and which has a small thickness at edges thereof between the first electrode 150 and the second electrode 170. In this case, when the OLED EL is driven, an electric field is locally concentrated in the effective light-emitting region and thus a main current path is formed. Thus, major emission occurs. In contrast, a region of the organic emissive layer 160 corresponding to the plurality of concave curves 141a may be an ineffective light-emitting region of the OLED EL.

The maximum slope Smax of the plurality of convex curves 142a of the organic emissive layer 160 may be 20 to 60 degrees. Here, the maximum slope Smax of the organic emissive layer 160 refers to a maximum slope angle between a tangent line of a bottom surface of the plurality of convex curves 142a and a horizontal plane. When the maximum slope Smax of the plurality of convex curves 142a of the organic emissive layer 160 is less than 20 degrees or greater than 60 degrees, a major light-emitting region of the OLED EL may change.

Similarly, the second electrode 170 of the OLED EL may have a plurality of curves corresponding to those of the organic emissive layer 160. Thus, multiple reflection of light emitted from the OLED EL may occur and thus a large amount of light may be extracted outside the organic light-emitting display device 100. Furthermore, the overcoat layer 140 may have a plurality of peak portions or a plurality of concave portions corresponding to the plurality of curves of the organic emissive layer 160. That is, since the organic emissive layer 160 has the plurality of curves, the top surface of the overcoat layer 140 may have a shape according to the morphology of the organic emissive layer 160.

Similarly, since the organic emissive layer 160 has the plurality of curves, the top surface of the first electrode 150 of the OLED EL may have a shape according to the morphology of the organic emissive layer 160.

Although FIG. 1 illustrates that in the light-emitting region, the top surfaces of the overcoat layer 140 and the first electrode 150 according to the present embodiment have shapes according to the morphology of the organic emissive layer 160, the organic light-emitting display device 100 according to an embodiment is not limited thereto, and at least one of the overcoat layer 140 and the first electrode 150 may have a shape according to the morphology of the organic emissive layer 160 in the light-emitting region.

However, the shape of the organic light-emitting display device 100 according to an embodiment is not limited to that illustrated in FIG. 1, provided that the organic emissive layer 160 and the second electrode 170 each have a plurality of curves in the light-emitting region.

The organic light-emitting display device 100 according to an embodiment may be a bottom emission type organic light-emitting display device, but embodiments of the present disclosure are not limited thereto and are applicable to a top-emission organic light-emitting display device or a dual emission type organic light-emitting display device if needed.

Figure 2:
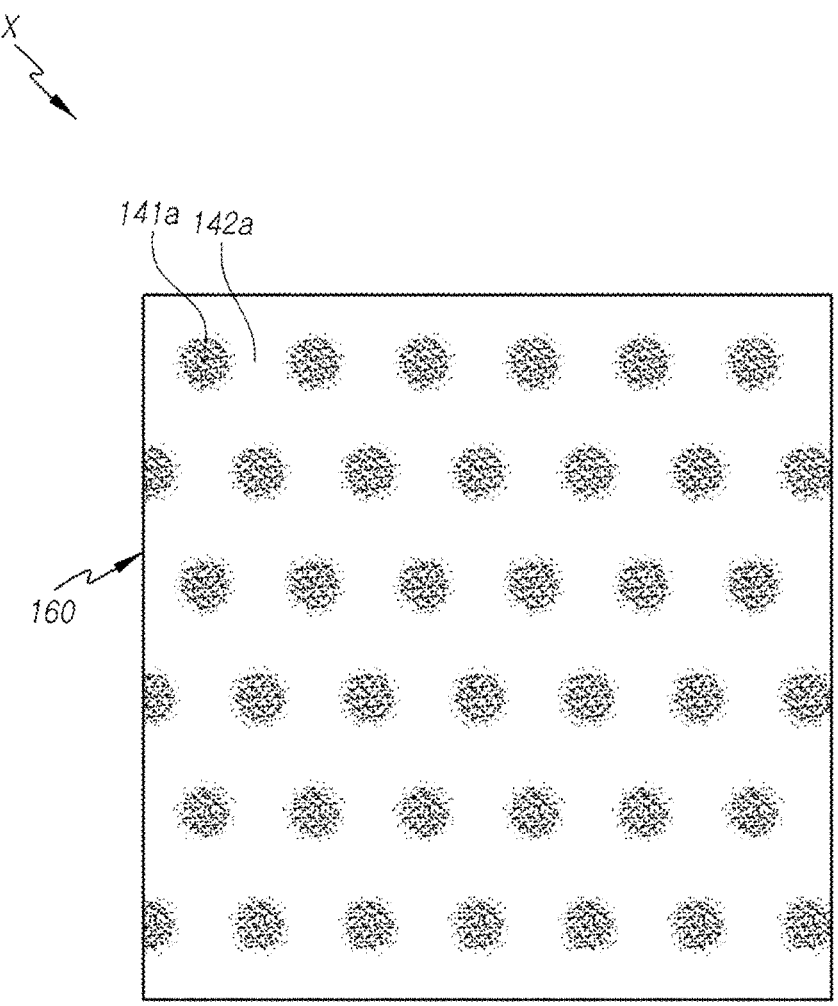
FIG. 2 is a plan view of an organic emissive layer in a region X of FIG. 1.

The above-described structure of the organic light-emitting display device 100 will be described in detail with reference to FIGS. 2 and 3 below. FIG. 2 is a plan view of an organic emissive layer in a region X of FIG. 1. Referring to FIG. 2, in the light-emitting region, the organic emissive layer 160 includes the plurality of convex curves 142a and the plurality of concave curves 141a. In this case, the plurality of concave curves 141a of the organic emissive layer 160 may have a round shape when viewed from a plan view. The plurality of convex curves 142a of the organic emissive layer 160 may have a form surrounding the plurality of concave curves 141a However, the plurality of concave curves 141a according to an embodiment are not limited to the round shape, and may have various shapes such as a hemispherical shape, a semi-ellipsoidal shape, or a polygonal shape.

Figure 3:
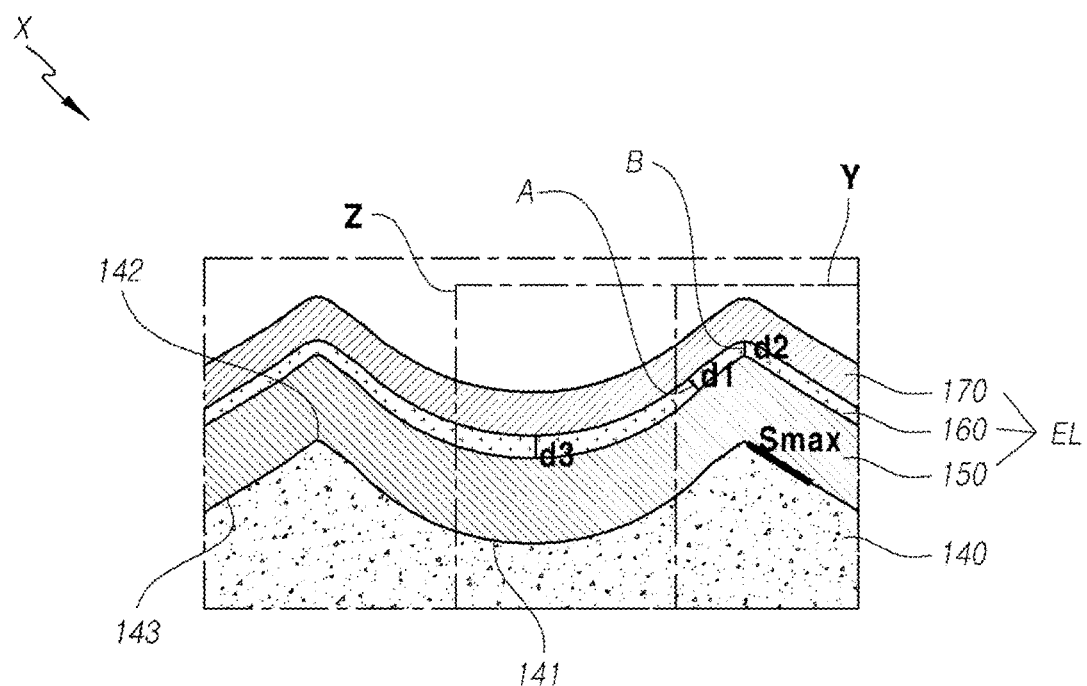
FIG. 3 is an enlarged cross-sectional view of the region X of FIG. 1.

FIG. 3 is an enlarged cross-sectional view of the region X of FIG. 1. Referring to FIG. 3, the overcoat layer 140 according to an embodiment includes a plurality of peak portions 142 and a plurality of concave portions 141. The organic emissive layer 160 and the second electrode 170 of the OLED EL formed on the overcoat layer 140 including the plurality of peak portions 142 and the plurality of concave portions 141 may each have a shape according to the morphology of the overcoat layer 140.

That is, a region of each of the organic emissive layer 160 and the second electrode 170 of the OLED EL corresponding to the region of the overcoat layer 140 including the plurality of peak portions 142 and the plurality of concave portions 141 may have a plurality of convex or concave curves. Similarly, a region of the first electrode 150 of the OLED EL corresponding to the region of the overcoat layer 140 including the plurality of peak portions 142 and the plurality of concave portions 141 may have a plurality of convex or concave curves.

When the organic emissive layer 160 of the OLED EL has the plurality of convex or concave curves, thicknesses of regions of the organic emissive layer 160 in the light-emitting region may be different from each other. Here, the thicknesses of the regions of the organic emissive layer 160 refer to vertical lengths thereof from a tangent line of the plurality of convex or concave curves of the organic emissive layer 160 in regions of the organic emissive layer 160 corresponding to the concave portions 141 and the peak portions 142 of the overcoat layer 140.

In detail, a thickness d1 of a region A of the organic emissive layer 160 between the peak portion 142 and the concave portion 141 of the overcoat layer 140 which is perpendicular to the first electrode 150, and a thickness d2 of a region B of the organic emissive layer 160 corresponding to the peak portion 142 of the overcoat layer 140 may be less than a thickness d3 of a region of the organic emissive layer 160 corresponding to the concave portion 141 of the overcoat layer 140.

For example, when the organic emissive layer 160 is formed according to a deposition method among various available methods, the organic emissive layer 160 deposited in a direction perpendicular to the substrate 110 may have a uniform thickness but may have a shape according to the morphology of the overcoat layer 140.

According to features of a deposition process, a thickness of the organic emissive layer 160 is smallest at a location at which the organic emissive layer 160 has a largest slope. In detail, the organic emissive layer 160 has a smallest thickness in the regions A and B and a region between the regions A and B of FIG. 3. Thus, in the OLED EL, a highest electric field is applied to the thinnest region of the organic emissive layer 160 and major emission occurs in the thinnest region.

In other words, the thickness d1 of the region A of the organic emissive layer 160 corresponding to a region 143 with a maximum slope Smax (hereinafter referred to as a 'connection portion 143') of the peak portion 142 of the overcoat layer 140 is less than the thicknesses d2 and d3 of the regions of the organic emissive layer 160 respectively corresponding to the peak portion 142 and the concave portion 141 of the overcoat layer 140. Thus, major emission occurs in a region of the OLED EL corresponding to the connection portion 143 of the overcoat layer 140.

Although for convenience of explanation, a region with the maximum slope Smax of the peak portion 142 is referred to as the connection portion 143, the connection portion 143 may be a whole inclined plane of the peak portion 142.

When the OLED EL has a micro-lens array to improve external light extraction efficiency, convex curves occur on a surface of the OLED EL due to the peak portions 142 of the overcoat layer 140 according to features of a pattern of the micro-lens array as illustrated in FIG. 2.

In this case, in a region of the organic emissive layer 160 with a large slope, the thickness d1 of an edge of the organic emissive layer 160 between the first electrode 150 and the second electrode 170 is small and thus an effective light-emitting region Y in which an electric field is locally concentrated, i.e., a region including the peak portion 142 and the connection portion 143 of the overcoat layer 140, occurs.

In this case, when the OLED EL is driven, a main current path is formed and thus major emission occurs in the effective light-emitting region Y due to local concentration of an electric field, whereas the concave portion 141 of the overcoat layer 140 may be an ineffective light-emitting region Z.

In the light-emitting region of the organic light-emitting display device 100 according to an embodiment, the overcoat layer 140 includes a micro-lens array pattern including the plurality of concave portions 141, the plurality of peak portions 142 and the plurality of connection portions 143.

Thus, an angle of a path of light which is emitted from the organic emissive layer 160 and which may be totally reflected and trapped inside the first electrode 150 and the organic emissive layer 160 is changed to be smaller than a total-reflection critical angle due to the micro-lens array inserted into the overcoat layer 140, thereby increasing an amount of the light to be extracted outside the organic light-emitting display device 100 and thus improving external luminous efficiency.

In this case, a propagation angle of the light emitted from the organic emissive layer 160 is changed by the inserted micro-lens array. The propagation angle of the light may become significantly different by even a fine change in a shape of the micro-lens array.

As described above, a propagation angle of light may vary according to the shape of the peak portions 142 of the overcoat layer 140, thereby changing external light extraction efficiency. That is, in the organic light-emitting display device 100 according to an embodiment, a degree to which light totally reflected and trapped inside the organic emissive layer 160 is extracted to the outside may vary according to a light path depending on the shape of the peak portions 142 of the overcoat layer 140 inserted to improve external light extraction efficiency.

As described above, a change in the light path according to the shape of the peak portions 142 or the concave portions 141 of the overcoat layer 140 inserted to improve the external light extraction efficiency may be a major factor improving light extraction efficiency. For convenience of explanation, variables determining the shape of the peak portions 142 of the overcoat layer 140 will be described below.

Variables which determine the convex portions of the overcoat layer 140 may include a diameter D, a height H, an aspect ratio A/R, a full width at half maximum F, a full width at half maximum aspect ratio F_A/R (=H/F), a slope S, a gap G between bottoms of two adjacent peak portions 142, a half height aspect ratio-versus-aspect ratio Rm (ratio of MLA= (F_A/R)/(A/R)), etc. of the peak portions 142 of the overcoat layer 140.

Figure 4:
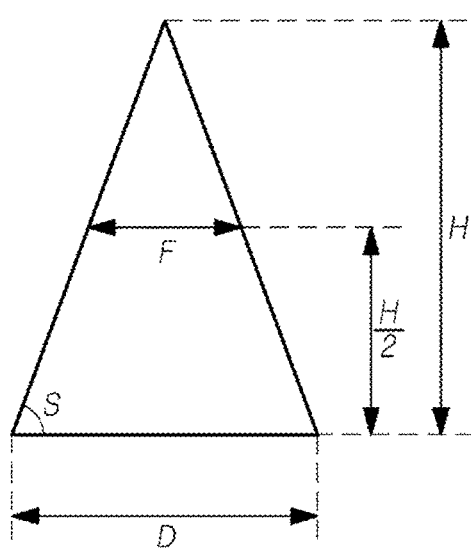
FIG. 4 is a conceptual diagram of variables determining a shape of peak portions of an overcoat layer.
Figure 5:
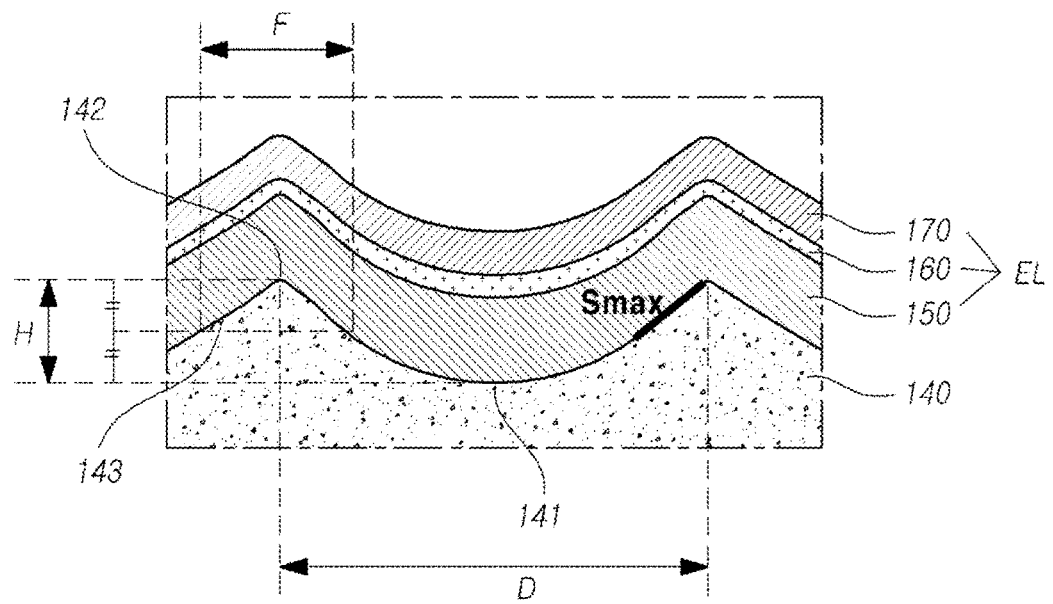
FIG. 5 is a diagram illustrating variables determining a shape of peak portions of an overcoat layer of an organic light-emitting display device according to an embodiment.
Figure 6:
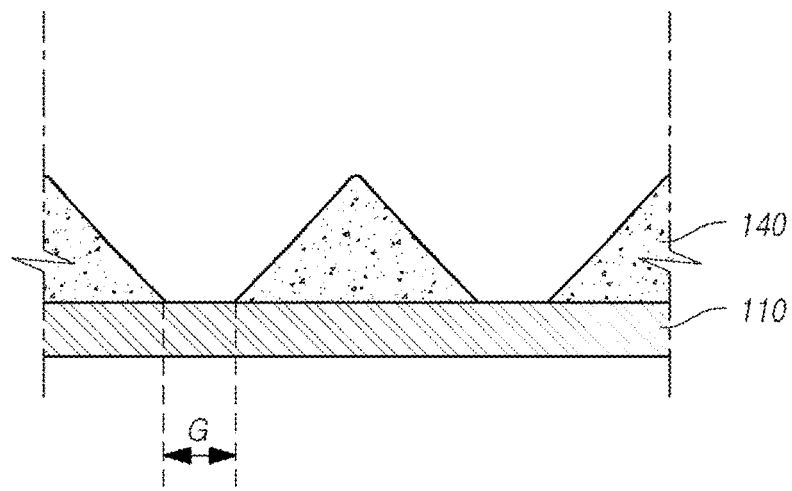
FIG. 6 is a conceptual diagram for explaining a gap in a micro-lens array.

FIG. 4 is a conceptual diagram of variables determining the shape of a peak portion of an overcoat layer. FIG. 5 is a diagram illustrating variables determining a shape of a peak portion of an overcoat layer of an organic light-emitting display device according to an embodiment. FIG. 6 is a conceptual diagram for explaining a gap G in a micro-lens array.

Referring to FIGS. 4 and 5, the diameter D of the peak portions 142 of the overcoat layer 140 refers to the distance between centers of two adjacent peak portions 142. The height H of the peak portions 142 of the overcoat layer 140 refers to a vertical length from the bottom of the concave portions 141 to the top of the peak portions 142. The full width at half maximum F refers to a width of the peak portions 142 at a half the height H as illustrated in FIG. 4. The aspect ratio A/R of the peak portions 142 refers to a value obtained by dividing the height H of the peak portions 142 by a radius D/2 of the peak portions 142.

In one embodiment, the diameter D of the peak portions 142 of the overcoat layer 140 may be 1 μm to 5 μm, and the height H thereof may be 0.6 μm to 1.3 μm. When the diameter D and the height H of the peak portions 142 are in the above-described ranges, the aspect ratio A/R of the peak portions 142 may be in a range of 0.24 to 2.6, and preferably, a range of 0.3 to 0.5. The full width at half maximum F of the peak portions 142 may be 0.975 μm to 1.5 μm. Thus, the full width at half maximum aspect ratio F_A/R of the peak portions 142 may be 0.4 to 0.75.

As described above, when the aspect ratio A/R of the peak portions 142 of the overcoat layer 140 is 0.3 to 0.5, the full width at half maximum aspect ratio F_A/R may increase and thus a condition that the half height aspect ratio-versus-aspect ratio Rm should be 1.2 or more may be satisfied. The half height aspect ratio-versus-aspect ratio Rm of the peak portions 142 is a ratio between the full width at half maximum aspect ratio F_A/R and the aspect ratio A/R and may be thus a variable determining a region with a steepest maximum slope Smax.

Thus, in the organic light-emitting display device 100 according to an embodiment, the aspect ratio A/R of the peak portions 142 of the overcoat layer 140 may be a low value ranging from 0.3 to 0.5. Due to the range of the aspect ratio A/R of the peak portions 142, the full width at half maximum aspect ratio F_A/R may be 0.4 to 0.75. A surface of the organic light-emitting display device 100 according to an embodiment on which the OLED EL is located may be a top surface of the overcoat layer 140 having the peak portions 142 satisfying the above-described condition.

By forming the peak portions 142 of the overcoat layer 140 to satisfy the above-described condition, an increase rate in current efficiency of the organic light-emitting display device 100 may be higher than that in current efficiency of an organic light-emitting display device including the peak portions 142 which are not in the above-described ranges, as will be described in detail with reference to FIGS. 8 and 9 below.

If only the aspect ratio A/R is applied as a variable defining the shape of the peak portions 142 of the overcoat layer 140, the shape of the peak portions 142 of the overcoat layer 140 may change when values defined by the other variables such as the full width at half maximum F and the gap G between the bottoms of two adjacent peak portions 142 are changed, although the aspect ratio A/R is the same and thus ratios defined only by the diameter D and the height H are the same.

Figure 7:
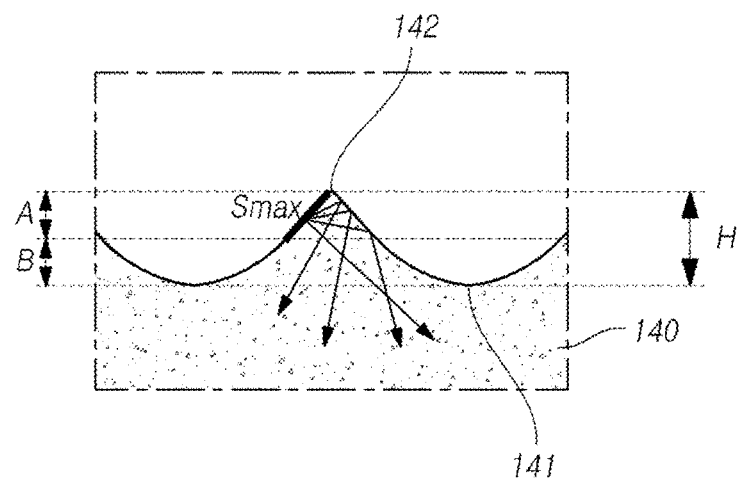
FIG. 7 is a diagram illustrating a light path at a maximum slope location on a peak portion according to an embodiment.

The overcoat layer 140 having the peak portions 142 which are in the above-described ranges will be described in detail below. FIG. 7 is a diagram illustrating a light path at a maximum slope location on a peak portion according to the present embodiment.

Referring to FIG. 7, the peak portion 142 of the overcoat layer 140 includes a second region A with the maximum slope Smax. In detail, when the peak portion 142 of the overcoat layer 140 is divided into halves with respect to the height H thereof, the peak portion 142 may be divided into a first region B adjacent to the concave portion 141 and the second region A farther from the concave portion 141 than the first region B. In one embodiment, the second region A of the peak portion 142 may have the maximum slope Smax. In other words, an upper region of the peak portion 142 is the second region A with the maximum slope Smax with respect to a horizontal line dividing a height of the peak portion 142 into halves, and a lower region of the peak portion 142 is the first region B with a slope less than that of the second region A.

As described above with reference to FIG. 4, the half height aspect ratio-versus-aspect ratio Rm of the peak portion 142 according to an embodiment may be 1.2 or more. Furthermore, referring to FIGS. 4 and 7, when the half height aspect ratio-versus-aspect ratio Rm of the peak portion 142 is less than 1.2, the first region B is a region with the maximum slope Smax of the peak portion 142. When the half height aspect ratio-versus-aspect ratio Rm of the peak portion 142 is 1.2 or more, the second region A is a region with the maximum slope Smax.

In other words, since the half height aspect ratio-versus-aspect ratio Rm of the peak portion 142 according to an embodiment is less than 1.2 or more, the region A may be a region with the maximum slope Smax.

Alternatively, a whole inclined plane of the peak portion 142 of the overcoat layer 140 may have the maximum slope Smax. That is, a slope of the concave portion 141 of the overcoat layer 140 according to an embodiment may be less than the slope S of the peak portion 142.

Accordingly, as illustrated in FIG. 7, the micro-lens array of the overcoat layer 140 has a shape of which a slope of the inclined plane increases from the concave portion 141 to the peak portion 142, and may thus taper from the concave portion 141 to the peak portion 142.

In this case, as illustrated in FIG. 4, the slope S of the peak portion 142 is understood to mean an angle between a tangent line of the bottom surface of the peak portion 142 and a horizontal plane. The maximum slope Smax may be understood to mean a maximum angle between the tangent line of the bottom surface of the peak portion 142 and the horizontal plane. Here, the slope S of the peak portion 142 may be 20 to 60 degrees. When the slope S of the peak portion 142 is not in the above-described range, the amount of light extracted through the overcoat layer 140 may decrease.

Thus, as illustrated in FIG. 3, a region of the organic emissive layer 160 located on the overcoat layer 140 and corresponding to the second region A with the maximum slope Smax of the peak portion 142 may be thinnest. The thickness of the organic emissive layer 160 refers to a length of a region of the organic emissive layer 160 corresponding to the second region A with the maximum slope Smax of the peak portion 142 and perpendicular to a tangent line of a curve of the organic emissive layer 160. Thus, an electric field is concentrated in the region of the organic emissive layer 160 corresponding to the peak portion 142 of the overcoat layer 140 and thus the OLED EL may exhibit maximum luminous efficiency.

Furthermore, as illustrated in FIG. 7, the peak portion 142 of the overcoat layer 140 has a tapered shape and thus a light path in a lateral direction may decrease, thereby improving external light extraction efficiency. That is, in the organic light-emitting display device 100 according to an embodiment, a region of the OLED EL corresponding to the peak portion 142 of the layer 140 has maximum luminous efficiency, and light extraction efficiency at the peak portion 142 of the overcoat layer 140 is high.

Although the aspect ratios A/R of the peak portions 142 of the overcoat layer 140 are substantially the same, the peak portions 142 may have various shapes. For example, even if a peak portion has the same or substantially the same aspect ratio A/R as the peak portion 142 of the overcoat layer 140 according to an embodiment, the peak portion may have a plump shape unlike the shape of the peak portion 142 according to the present embodiment. In detail, even if a peak portion has the same or substantially the same aspect ratio A/R as the peak portion 142 according to the present embodiment, a change in the full width at half maximum F of the peak portion 142 may result in a change in a shape of the peak portion, as will be described in detail with reference to FIG. 8 below.

Figure 8:
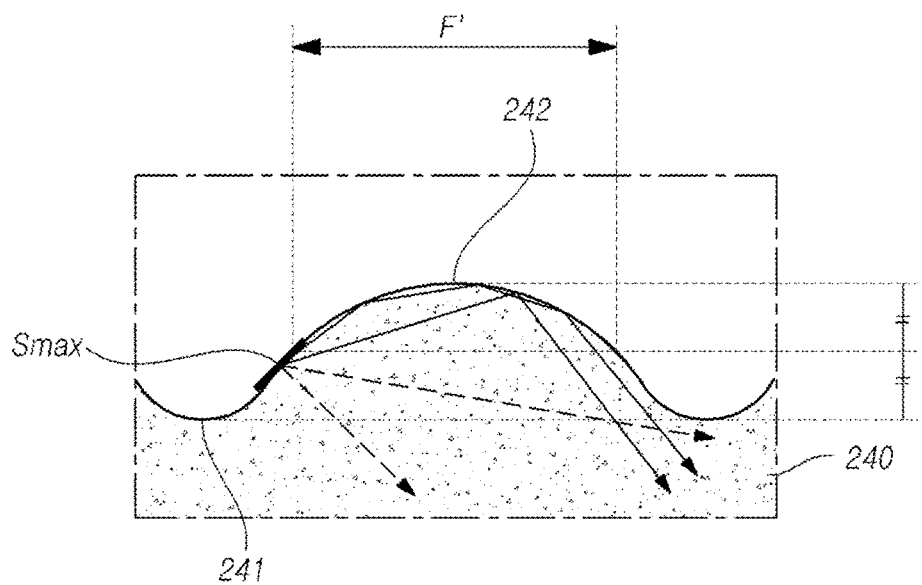
FIG. 8 is a diagram illustrating a shape of a peak portion of an overcoat layer according to a comparative example.

FIG. 8 is a diagram illustrating a shape of a peak portion of an overcoat layer according to a comparative example. Referring to FIG. 8, an aspect ratio A/R of a peak portion 242 of an overcoat layer 240 according to the comparative example may be the same or substantially the same as that of the peak portion 142 of the overcoat layer 140 according to the present embodiment illustrated in FIG. 7.

In contrast, a full width at half maximum F' of the peak portion 242 of the overcoat layer 240 according to the comparative example may be greater than the full width at half maximum F of the peak portion 142 of the overcoat layer 140 according to an embodiment illustrated in FIG. 7. In this case, a region with a maximum slope Smax of the peak portion 242 of the overcoat layer 240 according to the comparative example is located more adjacent to a concave portion 241 than the region with the maximum slope Smax of the peak portion 142 of the overcoat layer 140 according to the present embodiment.

Thus, a propagation path of light emitted from the OLED EL on the overcoat layer 140 may be different from that of light emitted from an OLED on the overcoat layer 240. In detail, major emission occurs in a region of the OLED corresponding to the region with the maximum slope Smax of the overcoat layer 140 or 240, and a path in which light emitted from the region of the OLED is extracted to the outside varies according to the shape of the peak portion 142 or 242 of the overcoat layer 140 or 240.

As illustrated in FIG. 8, a part of light emitted from a region of the overcoat layer 240 according to the comparative example corresponding to the region with the maximum slope Smax is extracted to the outside of a substrate while colliding against a side of a region having maximum slope Smax of the overcoat layer 240, but the remaining light is not extracted to the outside of the substrate and is trapped inside. That is, light extraction efficiency according to the comparative example is low.

In contrast, as illustrated in FIG. 7, a large amount of light emitted from the region of the overcoat layer 140 corresponding to the region with the maximum slope Smax collides against a side of the region with the maximum slope Smax and is thus extracted to the outside of the substrate. That is, in the present embodiment, light extraction efficiency may be improved.

Next, current efficiencies according to an embodiment and a comparative example will be described with reference to FIG. 9 below. FIG. 9 is a graph showing current efficiency versus a shape of a peak portion of an overcoat layer.

Figure 9:
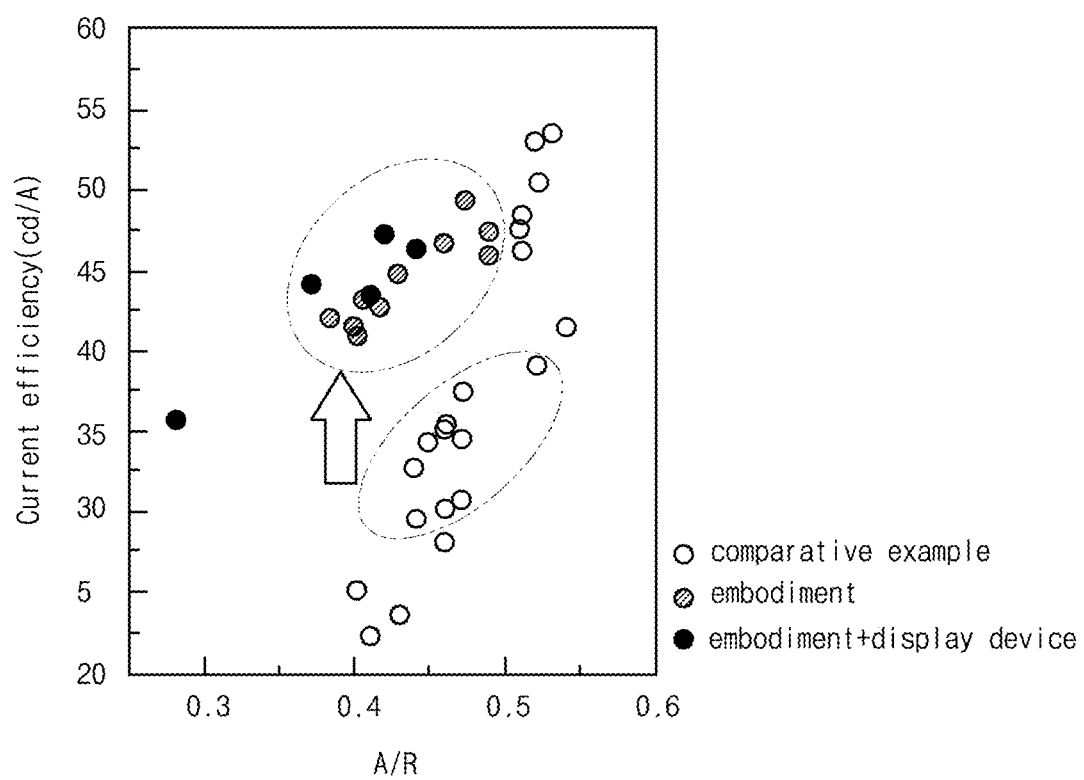
FIG. 9 is a graph showing current efficiency versus a shape of a peak portion of an overcoat layer.

Referring to FIG. 9, when an aspect ratio A/R of a peak portion is 0.5 or less, current efficiency of an organic light-emitting display device according to an embodiment is higher than that of an organic light-emitting display device according to a comparative example (see FIG. 8). That is, even if aspect ratios A/R of overcoat layers according to the present embodiment and the comparative example are the same or substantially the same, it can be seen that as full widths at half maximum F of the peak portions of the overcoat layers decrease, the current efficiencies according to the present embodiment and the comparative example are different. In particular, when an overcoat layer according to an embodiment is applied to a display device, current efficiency may be more improved. This means when a thin organic emissive layer is stacked on a peak portion according to an embodiment, an OLED may have an optimum structure and thus current efficiency may be more improved.

On the other hand, the aspect ratio A/R of the peak portion is proportional to diffuse reflectance of a panel. That is, an increase in the aspect ratio A/R of the peak portion results in an increase in the diffuse reflectance. Here, the diffuse reflectance refers to the reflectance of a display device improved when a part of light incident from the substrate is reflected in the same state as a polarization axis of a polarizing plate. Even when the diffuse reflectance is high, when current efficiency is high, black luminosity of an organic light-emitting display device may be degraded.

Figure 10:
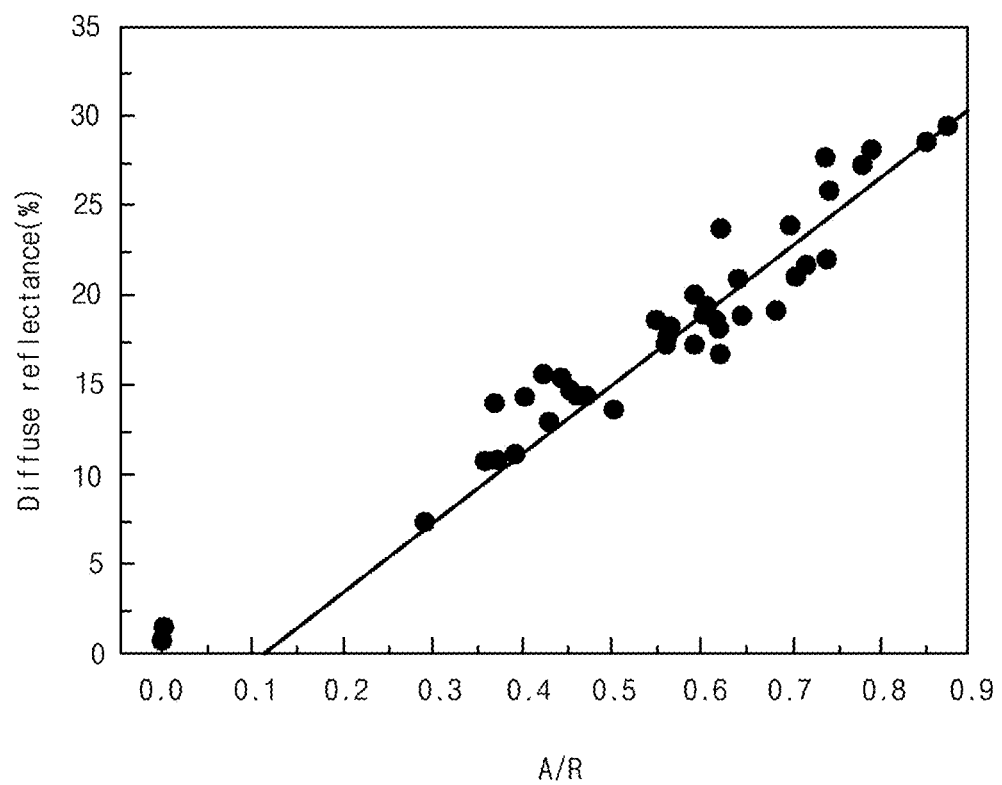
FIG. 10 is a graph showing a diffuse reflectance versus an aspect ratio A/R of a peak portion according to an embodiment.

Therefore, there is a need for a structure capable of decreasing diffuse reflectance and having improved current efficiency. A structure according to an embodiment may satisfy this need as will be described with reference to FIG. 10 below. FIG. 10 is a graph showing a diffuse reflectance versus an aspect ratio A/R of a peak portion according to an embodiment.

Referring to FIG. 10, in a structure having a peak portion according to an embodiment, the diffuse reflectance increases when the aspect ratio A/R of the peak portion increases. On the other hand, when the diffuse reflectance of a panel into which a micro-lens array is inserted is about 20% or less, a viewer may not be able to recognize that black luminosity has been degraded. The diffuse reflectance of an organic light-emitting display device having a peak portion according to an embodiment is about 20% or less when an aspect ratio A/R thereof is less than 0.6.

That is, referring to results shown in the graphs of FIGS. 9 and 10, the organic light-emitting display device having the peak portion according to the present embodiment has high current efficiency and low diffuse reflectance when the aspect ratio A/R of the peak portion is 0.5 or less.

As described above, since a slope of an inclined plane of a peak portion of an overcoat layer according to an embodiment is greater than that of a concave portion of the overcoat layer, major emission may occur in a region of an OLED corresponding to the peak portion. Thus, current efficiency may be increased, light extraction efficiency may be improved, and low diffuse reflectance may be obtained.

In an OLED and an organic light-emitting device including the same according to embodiments, in a light-emitting region, a slope of an inclined plane of peak portions of an overcoat layer is greater than that of an inclined plane of concave portions of the overcoat layer, thereby decreasing reflectance and improving current efficiency.

While an OLED applicable to an organic light-emitting display device according to an embodiment has been described above, embodiments are not limited thereto. The OLED according to an embodiment may be used alone or applied to an organic light-emitting device, such as an illumination device with an OLED, and the like.

It will be apparent to those skilled in the art that various modifications and variations can be made in the organic light emitting diode and the organic light emitting device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting diode, comprising:
a first electrode;
an organic emissive layer on the first electrode and including at least one of a plurality of convex curves, wherein a thickness of an inclined plane of an upper region of the organic emissive layer with respect to a horizontal line dividing a height of the plurality of convex curves into halves is less than a thickness of an inclined plane of a lower region of the organic emissive layer; and
a second electrode on the organic emissive layer.

2. The organic light-emitting diode of claim 1, wherein a slope of the organic emissive layer of the upper region is greater than a slope of the organic emissive layer of the lower region.

3. The organic light-emitting diode of claim 1, wherein a slope of the first electrode of the upper region is greater than a slope of the first electrode of the lower region, and a slope of the second electrode of the upper region is greater than a slope of the second electrode of the lower region.

4. The organic light-emitting diode of claim 1, wherein the plurality of convex curves have an aspect ratio of 0.3 to 0.5 and a diameter of 1 μm to 5 μm.

5. The organic light-emitting diode of claim 1, wherein the plurality of convex curves have a full width at half maximum of 0.975 μm to 1.5 μm and a full width at half maximum aspect ratio of 0.4 to 0.75.

6. The organic light-emitting diode of claim 1, wherein the plurality of convex curves have a half height aspect ratio-versus-aspect ratio of 1.2 or more.

7. The organic light-emitting diode of claim 1, wherein the plurality of convex curves or the plurality of concave curves have a maximum slope of 20 degrees to 60 degrees.

8. An organic light-emitting device, comprising:
a substrate divided into a light-emitting region and a non-light-emitting region;
a first electrode on the substrate;
an organic emissive layer on the first electrode; and
a second electrode on the organic emissive layer,
wherein the first electrode, the organic emissive layer and the second electrode include at least one of a plurality of convex curves in the light emitting region, and
wherein a thickness of an inclined plane of an upper region of the first electrode, the organic emissive layer and the second electrode with respect to a horizontal line dividing a height of the plurality of convex curves into halves is less than a thickness of an inclined plane of a lower region of the first electrode, the organic emissive layer and the second electrode.

9. The organic light-emitting diode of claim 8, wherein a slope of the organic emissive layer of the upper region is greater than a slope of the organic emissive layer of the lower region.

10. The organic light-emitting diode of claim 8, wherein a slope of the first electrode of the upper region is greater than a slope of the first electrode of the lower region, and a slope of the second electrode of the upper region is greater than a slope of the second electrode of the lower region.

11. The organic light-emitting diode of claim 8, further comprising an overcoat layer between the substrate and the first electrode, wherein the overcoat layer includes at least one of a plurality of convex portions in the light emitting region.

12. The organic light-emitting device of claim 11, wherein the plurality of convex portions have an aspect ratio of 0.3 to 0.5, a height of 0.6 μm to 1.3 μm and a diameter of 1 μm to 5 μm.

13. The organic light-emitting device of claim 11, wherein the plurality of convex portions have a full width at half maximum of 0.975 μm to 1.5 μm and a full width at half maximum aspect ratio of 0.4 to 0.75.

14. The organic light-emitting device of claim 11, wherein the plurality of convex portions have a half height aspect ratio-versus-aspect ratio of 1.2 or more.

15. The organic light-emitting device of claim 11, wherein the plurality of convex portions have a maximum slope of 20 degrees to 60 degrees.

* * * * *